United States Patent
Waicukauski et al.

(10) Patent No.: US 11,422,186 B1
(45) Date of Patent: Aug. 23, 2022

(54) PER-SHIFT X-TOLERANT LOGIC BUILT-IN SELF-TEST

(71) Applicant: Synopsys, Inc., Mountain View, CA (US)

(72) Inventors: John A. Waicukauski, Tualatin, OR (US); Peter Wohl, Williston, VT (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/906,748

(22) Filed: Jun. 19, 2020

Related U.S. Application Data

(60) Provisional application No. 62/863,919, filed on Jun. 20, 2019.

(51) Int. Cl.
  *G01R 31/3177* (2006.01)
  *G01R 31/3185* (2006.01)
  *G01R 31/3183* (2006.01)

(52) U.S. Cl.
  CPC . *G01R 31/3177* (2013.01); *G01R 31/318335* (2013.01); *G01R 31/318357* (2013.01); *G01R 31/318385* (2013.01); *G01R 31/318533* (2013.01); *G01R 31/318536* (2013.01); *G01R 31/318544* (2013.01); *G01R 31/318547* (2013.01)

(58) Field of Classification Search
  CPC ........ G01R 31/3177; G01R 31/318335; G01R 31/318357; G01R 31/318385; G01R 31/318533; G01R 31/318536; G01R 31/318544; G01R 31/318547
  USPC .... 714/726, 729, 741, 732, 724, 727, 30, 25
  See application file for complete search history.

(56) References Cited

U.S. PATENT DOCUMENTS

| | | | | |
|---|---|---|---|---|
| 6,993,694 | B1 * | 1/2006 | Kapur | G01R 31/318547 324/527 |
| 7,032,148 | B2 * | 4/2006 | Wang | G01R 31/318536 714/726 |
| 7,376,873 | B2 * | 5/2008 | Vranken | G01R 31/31719 714/30 |
| 7,779,322 | B1 * | 8/2010 | Wang | G01R 31/318547 714/729 |
| 7,805,649 | B2 * | 9/2010 | Rajski | G01R 31/318547 714/732 |

(Continued)

OTHER PUBLICATIONS

Chickermane et al., Channel Masking Synthesis for Efficient On-Chip Test Compression, 2004, IEEE, pp. 452-461. (Year: 2004).*

(Continued)

*Primary Examiner* — John J Tabone, Jr.
(74) *Attorney, Agent, or Firm* — Park, Vaughan, Fleming & Dowler LLP; Laxman Sahasrabuddhe

(57) ABSTRACT

A circuit is described that can include: a first register to store a first value that specifies a first subset of a set of scan chains, wherein the first subset of the set of scan chains includes scan cells that are desired to be masked; a second register to store a second value that specifies, in each shift cycle, a second subset of the set of scan chains, wherein the second subset of the set of scan chains includes scan cells that are desired to be masked; and a masking circuit to mask, in each shift cycle, scan cells in a third subset of the set of scan chains that is an intersection of the first subset of the set of scan chains and the second subset of the set of scan chains.

16 Claims, 10 Drawing Sheets

(56) References Cited

U.S. PATENT DOCUMENTS

| | | | | |
|---|---|---|---|---|
| 7,882,409 | B2* | 2/2011 | Gizdarski | G01R 31/318547 714/729 |
| 7,979,763 | B2* | 7/2011 | Wohl | G01R 31/318547 714/728 |
| 8,103,925 | B2* | 1/2012 | Hapke | G01R 31/318547 714/726 |
| 8,103,926 | B2* | 1/2012 | Gizdarski | G01R 31/318547 714/729 |
| 8,464,115 | B2* | 6/2013 | Wohl | G01R 31/318547 714/728 |
| 8,645,780 | B2* | 2/2014 | Wohl | G01R 31/3177 714/732 |
| 8,650,524 | B1* | 2/2014 | Chakravadhanula | G06F 30/327 716/114 |
| 8,898,529 | B2* | 11/2014 | Goessel | G01R 31/318547 714/729 |
| 8,904,256 | B1* | 12/2014 | Chakravadhanula | G01R 31/318547 714/731 |
| 9,157,961 | B2* | 10/2015 | Wohl | G01R 31/318547 |
| 2004/0237015 | A1* | 11/2004 | Abdel-Hafez | G01R 31/318591 714/726 |
| 2005/0240848 | A1* | 10/2005 | Cote | G01R 31/318572 714/726 |
| 2006/0200719 | A1* | 9/2006 | Keller | G01R 31/318547 714/732 |
| 2007/0113128 | A1* | 5/2007 | Gizdarski | G01R 31/318335 714/726 |
| 2007/0234163 | A1* | 10/2007 | Mukherjee | G01R 31/3177 714/736 |
| 2008/0256497 | A1* | 10/2008 | Wohl | H03M 7/30 716/103 |
| 2009/0083596 | A1* | 3/2009 | Gizdarski | G06F 30/327 714/729 |
| 2009/0083597 | A1* | 3/2009 | Gizdarski | G01R 31/318547 714/729 |
| 2010/0100781 | A1* | 4/2010 | Wohl | G01R 31/3177 714/728 |
| 2010/0117658 | A1* | 5/2010 | Hapke | G01R 31/31919 324/537 |
| 2010/0299567 | A1* | 11/2010 | Hapke | G06F 11/27 714/726 |
| 2011/0258503 | A1* | 10/2011 | Wohl | G01R 31/318547 714/728 |
| 2011/0307750 | A1* | 12/2011 | Narayanan | G01R 31/3177 714/729 |
| 2013/0268817 | A1* | 10/2013 | Wohl | G01R 31/3177 714/727 |
| 2014/0281774 | A1* | 9/2014 | Wohl | G01R 31/318547 714/727 |
| 2014/0281777 | A1* | 9/2014 | Bhattacharya | G01R 31/318371 714/729 |
| 2014/0289579 | A1* | 9/2014 | Podder | G01R 31/318547 714/738 |
| 2014/0304672 | A1* | 10/2014 | Chebiyam | G01R 31/318547 716/122 |
| 2014/0317463 | A1* | 10/2014 | Chandra | G01R 31/31723 714/729 |
| 2014/0372822 | A1* | 12/2014 | Saiki | G01R 31/3177 714/727 |

OTHER PUBLICATIONS

Rabenalt et al., Highly Efficient Test Response Compaction Using a Hierarchical X-Masking Technique, Jun. 2012, IEEE, vol. 31, No. 6, pp. 950-957. (Year: 2012).*

Rabenalt et al., Masking of X-values by Use of a Hierarchically Configurable Register, 2009, IEEE, pp. 149-154. (Year: 2009).*

Rajski et al, Synthesis of X-Tolerant Convolutional Compactors, 2005, IEEE, pp. 1-6. (Year: 2005).*

Tyszer et al., X-Tolerant Compactor with On-Chip Registration and Signature-Based Diagnosis, 2007, IEEE, pp. 476-485. (Year: 2007).*

Wohl et al., Scalable Selector Architecture for X-Tolerant Deterministic BIST, Jun. 7-11, 2004, IEEE, pp. 934-939. (Year: 2004).*

Wohl et al., XLBIST: X-Tolerant Logic BIST, Oct. 1, 2018, IEEE, pp. 1-9. (Year: 2018).*

Wohl et al., Fully X-tolerant, Very High Scan Compression, 2010, IEEE, pp. 362-367. (Year: 2010).*

Wohl etr al., X-Tolerant Compression and Application of Scan-ATPG Patterns in a BIST Architecture, 2003, IEEE. (Year: 2003).*

* cited by examiner

| XTOL controls | Effect |
|---|---|
| 00 | All chains selected |
| 010 | No chains selected |
| 011+10 bits | Single chain (chosen by the 10 bits) is selected |
| 011+10 bits | XTOL_enable-ON and no chains selected |
| 1+6 bits | 1 of 16 groups selected (16 such modes) |
| 1+6 bits | Complement of 1/16 group (16 such modes) |
| 1+6 bits | 1 of 8 groups selected (8 such modes) |
| 1+6 bits | Complement of 1/8 group (8 such modes) |
| 1+6 bits | 1 of 4 groups selected (4 such modes) |
| 1+6 bits | Complement of 1/4 group (4 such modes) |
| 1+5 bits | 1 of 2 groups selected (2 such modes) |
| 1+5 bits | XTOL_enable-OFF and no chains selected |

FIG. 1B for each shift process window of shifts with no Xs (if any) — 252 cost of setting and holding mode < cost of setting XTOL_enable OFF, then ON → N

Y ↓ set mode which does not include any dynamic Xchain; hold mode for rest of shifts with no Xs set XTOL_enable OFF at start of window
set XTOL_enable ON at end of window process shift with X(s) — 254

X/shift: >1 / =1

=1 → single chain selection

>1 ↓ set mode which includes all chains with X in this shift process final window of shifts with no Xs (if any) — 256 cost of setting and holding mode < cost of setting XTOL_enable OFF → N

Y ↓ set mode which does not include any dynamic Xchain; hold mode for rest of shifts set XTOL_enable OFF at start of window

FIG. 2C

PER-SHIFT X-TOLERANT LOGIC BUILT-IN SELF-TEST

RELATED APPLICATION

This application claims benefit of U.S. Provisional Application Ser. No. 62/863,919, filed on 20 Jun. 2019, the contents of which are herein incorporated by reference in their entirety for all purposes.

TECHNICAL FIELD

The present disclosure relates to per-shift X-tolerant logic built-in self-test (PS-XLBIST).

BACKGROUND

Complex fault models required in testing advanced designs include stuck-at, transition delay, and shorts/opens, which can need 2-5 times more tester time and data than simpler patterns. Increases in test data volume and test application time have led to widespread usage of scan compression methods in addition to highly compacted vector sets generated by automatic test pattern generation (ATPG).

Scan load compression techniques exploit the low density of care bits in scan input data. Pseudo-random pattern generators (PRPGs) can be repeatedly or continuously re-seeded and provide the highest load data compression with low overhead. In logic built-in self-test (LBIST) applications, the PRPGs typically use a single random seed. Test points can be inserted to allow testing of otherwise hard-to-detect random-resistant faults.

Scan unload compression techniques exploit the low density of errors in scan output data, due to the fact that error values appear more or less randomly, and only on a few scan chains at a time. However, unknown unload values (Xs) can limit unload compression by masking observation (an X value can be a signal value that cannot be deterministically determined to be a 0 or a 1). Moreover, Xs can also limit load compression by requiring additional care bits to prevent Xs or mitigate their effect on unload data. Unfortunately, aggressive designs and technologies, and sophisticated fault models can also result in an increased number of Xs because sometimes the binary value captured in a scan cell cannot be predicted by the simulation used during the ATPG process. Although some Xs are known at design time, most do not have simple "fixes." Additionally, unknown values may result because of timing, operating parameters (voltage, temperature), or manufacturing defects.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

FIGS. 1A-1B illustrate a system that includes a Self-Test Using a Multiple-Input Signature Register (MISR) and a Parallel Shift (STUMPS) sequence generator LBIST architecture augmented with X-tolerance control (XTOL) components in accordance with some embodiments described herein.

FIG. 2C illustrates a process for determining XTOL shadow values for each CODEC and shift in accordance with some embodiments described herein.

DETAILED DESCRIPTION

Figure 1A:
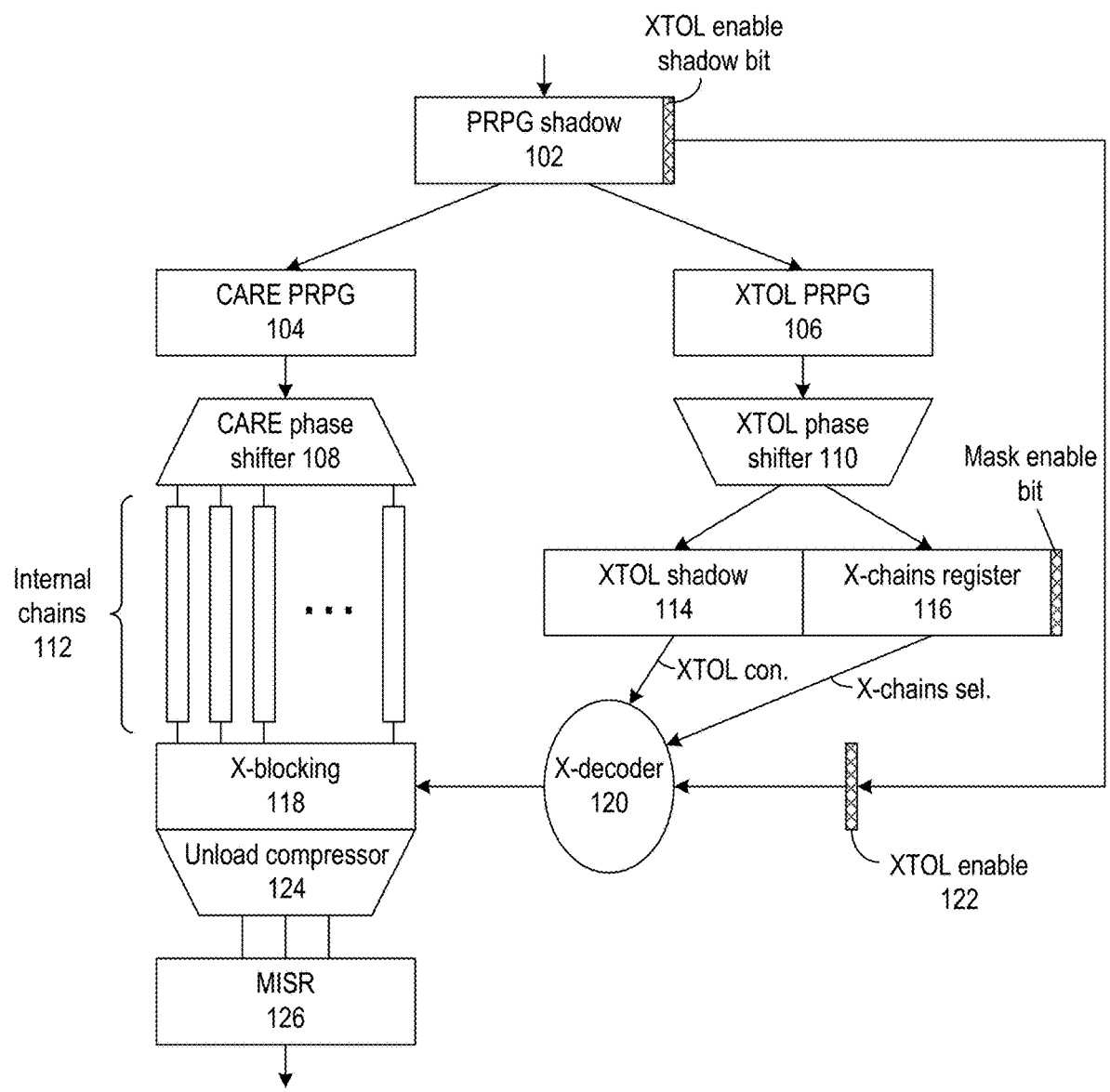

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosure. Thus, the scope of the disclosure is not limited to the embodiments shown, but is to be accorded the widest scope consistent with the principles and features disclosed herein.

Efficient handling of unknown simulation values (Xs) is important as LBIST has become a requirement for high-complexity, high-reliability ICs. LBIST circuitry in an IC design allows the IC design to test itself. Traditionally, LBIST has been applied when there are no Xs. However, eliminating all Xs in large IC designs can be difficult and anticipating all possible X-sources can be impractical.

LBIST employs on-chip pattern generation and response analysis to reduce the entire test set (e.g., the test set that is used to test the proper functioning of the IC chip) to a few seeds that can be either stored on chip (for in-system or power-on test) or applied through some test access method. LBIST can achieve very high scan compression based on the traditional STUMPS architecture, which is used to apply test patterns to the IC design and compare the responses of the IC design with the expected responses. The design logic remains unchanged; scan cells are configured in multiple short internal chains connected between on-chip compressor structures.

One barrier to using LBIST is how to deal with Xs that can corrupt the response (i.e., cause the response to be different from the correct response). These unknown values can be the result of tri-state structures, uninitialized state elements, cross clock domain signals, or analog blocks that are not fully wrapped for test. Even more troublesome are Xs that come from timing exceptions, setup or hold, that can affect the design and may be difficult to fix in a way that does not impact timing, power, or design schedule. The traditional wisdom has been that a design must be 100% X-clean to support LBIST; this has understandably discouraged wider deployment of LBIST, even as its benefits are recognized.

For deterministic ATPG scan compression, there have been a variety of response compaction techniques to deal with unknowns. These fall into two broad categories: (1)

techniques that make the output response tolerant of Xs, and (2) techniques that mask logic to block Xs from reaching the response compactor (which compacts or compresses the output response into a value with fewer bits). Solutions based on a mix of these two methods are also possible. The former can require less test data, but Xs in the compacted test responses can mask desired observability. The latter typically rely on extra test data, supplied by the tester along with the test stimulus, to control the masking logic. There are trade-offs in all these solutions in terms of logic complexity, collateral damage (how many non-X values also get masked), and test data required to control the masking. To limit over-masking the X-blocking logic can be controlled with bits derived from the load decompressor. Rather than blocking Xs from reaching the MISR, Xs can be periodically cleared from the MISR using periodic MISR unloads. As an alternative to the MISR, finite memory compactors contain memory elements but have finite impulse response, and consequently lower compression, as a continuous output stream must be measured. Convolutional compactors are a type of finite memory compactor based on check matrices of convolution codes. Current work on X-masking during LBIST has been limited to synthesizing masking logic based on Xs known in the current simulation model and a fixed set of generated patterns.

Embodiments disclosed herein feature PS-XLBIST, which can obtain an improved or close to maximal test coverage for designs with very few Xs by allowing the system to select which scan cells to mask at a fine-grain. Additionally, in the embodiments disclosed herein, the test coverage gradually decreases as more Xs are added. PS-XLBIST can mask Xs with no or minimal loss of observability of non-X values.

Embodiments disclosed herein can support an arbitrary number and density of Xs. PRPG seeds and good-machine MISR responses (which are the responses expected from a correctly functioning IC design) can be stored on chip, for autonomous testing (i.e., to check if input/output behavior of the IC design is correct), or can be supplied by an external tester. In PS-XLBIST, seeds drive PRPGs that load scan chains, and unload data are compressed in MISRs. Note that PS-XLBIST seeds also include X-masking data. Embodiments disclosed herein reduce data required for controlling X-tolerance to a similar size as the seed data used to generate test stimuli. Note that Xs can be masked post-silicon as PS-XLBIST patterns can be regenerated to account for Xs that were unknown at design time. By contrast, other approaches that use X-masking during LBIST are typically limited to synthesizing masking logic based on Xs known in the current simulation model and a fixed set of generated patterns.

Some embodiments described herein can use two registers (where each register can be a hardware register, i.e., one or more flip-flops) to control which scan chains are masked on a per scan cycle basis. The value stored in one register can specify a first subset of the set of scan chains that is to be masked, and the value stored in the second register can specify a second subset of the set of scan chains that is to be masked. In some embodiments, the value stored in the second register can specify, in a different mode as controlled by a third register (mask enable bit), the subset of scan chains that are observable. In each scan cycle, the scan chains that belong to the intersection of the two subsets can be masked. In this manner, in each scan cycle, the values stored in the two registers can be used to mask different subsets of scan chains.

The values stored in the two registers can be based on two seeds, i.e., one seed for each register. Note that a complete test can be viewed as a sequence of intervals. The value stored in the first register can remain constant throughout each interval, and can be updated before the start of each interval, and the value stored in the second register can be updated in each scan cycle within an interval. The seed that is used for determining the value of the first register can be used to set the value of the first register at the beginning of an interval. The seed that is used for determining the value of the second register can be provided to a PRPG, and the PRPG can generate new values for the second register in each shift cycle. The seed can be reloaded in the second register at the beginning of every pattern in an interval.

Some embodiments described herein can determine the seed values based on the scan chains that are required to be masked in each scan cycle of an interval. In particular, determining the seed for the second register can involve solving a set of linear equations. If the system of linear equations does not have a solution, then it may not be possible to mask exactly those scan cells that have unknown values. In some cases, other scan cells with non-X values may also be masked (this is referred to as "collateral damage" in this disclosure). However, as confirmed by results from multiple IC designs, embodiments described herein are able to minimize the amount of collateral damage.

Advantages of embodiments disclosed in the present disclosure include, but are not limited to, allowing LBIST to be performed in an IC design in the presence of Xs.

FIGS. 1A-1B illustrate a system comprising a STUMPS LBIST architecture (PRPG-scan chains-MISR) augmented with XTOL components in accordance with some embodiments described herein.

As the loading of a pattern is overlapped with the unloading of the previous pattern, input data can simultaneously supply load care bits for the current pattern and X-control bits for the previous unload. To facilitate independent generation of patterns, some embodiments described herein use separate PRPGs for load care bits (CARE PRPG 104) and X-tolerance controls (XTOL PRPG 106) as shown in FIG. 1A. This allows separating the loading and unloading of adjacent patterns, because X values are known during the ATPG process only after load care bits have been set, non-care bits have been computed and the design has been simulated. At this time, if the same PRPG were used for both load and unload bits, conflicts could limit available care bits and even result in unsatisfiable conditions.

In addition to the XTOL PRPG 106, the X-control circuitry includes the XTOL phase-shifter 110 (comprised of XOR gates), the XTOL shadow register 114, the X-chains register 116, the XTOL_enable bit 122, and the combinational X-decoder 120, and X-blocking logic 118.

The XTOL_enable bit 122, when ON, enables X-masking controlled by the XTOL PRPG 106, which provides per-shift X-controls to unload compressor 124. When the XTOL_enable bit 122 is OFF, X-masking is disabled. The XTOL_enable bit 122 is re-loaded with every CARE PRPG 104 or XTOL PRPG 106 reseed and can be used to disable X-masking when it is not needed in a window of consecutive shifts.

Further, an XTOL shadow register 114 can hold the XTOL-controls unchanged while the XTOL PRPG 106 advances to the next state where a new set of XTOL-control bits is needed; a single bit per shift is needed from the XTOL phase shifter 110 to control whether the XTOL shadow register 114 holds or updates with the output of the XTOL PRPG 106. This hold ability further decreases data needed for the XTOL PRPG 106 by replacing, for selected shifts, a multi-bit X-control code with a single-bit hold.

The X-chains register 116 can further reduce input data for deterministic ATPG patterns by exploiting the fact that Xs are often clustered in the design, rather than uniformly distributed. The X-chains register 116 is the same size as the XTOL shadow register 114 (e.g., 13 bits); both registers load from the output of the XTOL phase-shifter 110. During deterministic ATPG, the X-chains register 116 is used to mask scan chains that are mostly X, while the XTOL shadow register 114 allows a more fine-grained X-control.

During scan-ATPG test generation, ATPG merges as many faults as possible in every pattern. To support this ability, both PRPGs can be repeatedly reseeded from the tester during test application to obtain the desired deterministic test. A new seed is loaded as often as needed. The common PRPG shadow register 102 loads the next CARE or XTOL seed while the PRPGs, the internal chains, and the MISR continue operating with the previously loaded seeds, allowing reseed cycles to overlap with internal shift cycles. The content of the PRPG shadow register 102 can then be transferred, in a single cycle, to either PRPG. The PRPG shadow register 102 includes an XTOL_enable shadow bit: when the content of the PRPG shadow register 102 is transferred to either PRPG, XTOL_enable 122 is also set, and remains unchanged until the next shadow transfer.

The outputs of the XTOL shadow register 114 are labeled "XTOL controls" in FIG. 1A; the outputs of the X-chains register 116 are labeled "X-chains selection" in FIG. 1A. These are inputs to X-decoder 120 that determines, per shift, which chain outputs are blocked.

The design of X-decoder 120 is important to achieving full X-tolerance and maximal data compression for deterministic ATPG patterns; using too many XTOL controls increases XTOL PRPG input data but using too few XTOL controls at the expense of blocking too many non-X values reduces observability, thus increasing pattern count.

X-decoder 120 may support a "no-observability" mode to be used for shifts in which every chain output is X and may be blocked. Further, X-decoder 120 may be able to select any single chain to guarantee observability with full X-tolerance, i.e., any cell can be observed no matter how many other cells are X. For X-free shifts, the decoder allows full observability of all chains. Finally, several multiple-observability modes are configured to observe various subsets of chains which cover the middle ground between single and full observability. For example, modes can select $\frac{1}{16}$, $\frac{1}{8}$, $\frac{1}{4}$ or $\frac{1}{2}$ of all chains and complementary modes can select $\frac{15}{16}$, $\frac{7}{8}$ or $\frac{3}{4}$. There are multiple partitions of 16 groups of $\frac{1}{16}$ of all chains; multiple partitions of 8 groups of $\frac{1}{8}$ of all chains, etc. Groups of chains are defined to cover as many possible unique, non-overlapping configurations, but the number of configurations may be limited so that the total number of XTOL control bits needed is small. Modes are Huffman-encoded so that more commonly used modes need fewer XTOL control bits. Selecting a single chain requires the most XTOL controls; overall, the size of the XTOL shadow register is about $3+\log(\text{number of chains})$—for example, referring to the table shown in FIG. 1B which shows the mode encodings for 1023 chains, XTOL shadow register 114 would be $3+\log(1023)=13$ bits wide (note that the log of the number of chains is rounded up to the nearest integer). A mode can be selected only if no Xs are passed to MISR 126; modes are selected per shift such that observability is maximized while minimizing control bits.

Xs are identified during ATPG and both X-decoder 120 inputs and the ATPG process continuously adjust to the current distribution of Xs and targeted faults. The X-chains register 116 selects a set of "X-chains"—these can be observed, one at a time, when XTOL controls select a single-chain observe mode. Any chain can be selected as X-chain, and the selection changes only when the X-chains register 116 is reloaded. The X-chains register 116 uses the same groups as described above. For example, let the X-chains selection be a group that includes $\frac{1}{16}$ of all chains and, for a given shift, let the XTOL controls select a $\frac{7}{8}$ group. In this scenario, the chains observed in MISR 126 for this shift are the ones selected in the $\frac{7}{8}$ group except the ones that are also in the $\frac{1}{16}$ group of X-chains. Next, assume that the XTOL controls change to a full observe mode in the next shift. Now, all chains are observed in the MISR 126 except the $\frac{1}{16}$ that are X-chains. Finally, if XTOL controls changes to single-chain observe in the following shift, the selected chain will be observed in the MISR 126 regardless of whether it is an X-chain or not.

Both X-chains register 116 and XTOL shadow 114 select, independently, a group of chains determined by the modes presented, ranging from none, single-chain, $\frac{1}{16}$ of all chains, $\frac{1}{8}, \ldots, \frac{15}{16}$, or all chains. The selection of X-chains register 116 remains fixed until the next reload (which can be hundreds of patterns later); XTOL shadow 114 can change every shift, capturing data from the XTOL PRPG 106 which advances every shift.

The combined effect of the XTOL shadow 114 and the X-chains register 116 allow for quite flexible selections, ensuring no Xs reach MISR 126 while at the same time minimizing collateral damage (masking non-X cells). Additionally, XTOL_enable 122 and the ability to hold the XTOL shadow 114 value minimize the XTOL PRPG 106 input data. In some embodiments, for deterministic ATPG patterns, XTOL PRPG 106 can be reseeded as needed, in any shift of any pattern.

Some embodiments disclosed herein can include: a first register (e.g., X-chains register 116) to store a first value that specifies a first subset of a set of scan chains, wherein the first subset of the set of scan chains includes scan cells that are desired to be masked; a second register (e.g., XTOL shadow register 114) to store a second value that specifies, in each shift cycle, a second subset of the set of scan chains, wherein the second subset of the set of scan chains includes scan cells that are desired to be masked in that shift cycle; and a masking circuit (e.g., a combination of X-blocking circuit 118 and X-decoder 120) to mask, in each shift cycle, scan cells in a third subset of the set of scan chains that is an intersection of the first subset of the set of scan chains and the second subset of the set of scan chains. For example, the intersection may correspond to scan cells that are present in the first subset and the second subset.

The masking circuit can receive values from the set of scan chains in each shift cycle, and selectively block or pass the values to an unload compressor circuit. The first value (stored in the first register) and the second value (stored in the second register) can be generated based on seeds. Specifically, the values for the second register can be generated by a PRPG (e.g., XTOL PRPG 106) based on a seed, and determining the seed can involve solving a system of linear equations (as explained below). The disclosed embodiments can be part of a PS-XLBIST circuit that is designed to perform a PS-XLBIST test, which can include multiple intervals, and each interval can include multiple patterns (e.g., several hundred patterns), wherein the first value can remain constant during an interval, and wherein the second value can be updated in each shift cycle during each interval. Additionally, the second seed can be reloaded into a PRPG register associated with the PRPG at a beginning of each pattern in an interval.

More specifically, each interval can be defined by:
CARE PRPG seed: the CARE PRPG generates pseudorandom values for all pattern loads in the interval.
Clocking: patterns in an interval apply a set of clocks that does not include disturbed clock pairs. Multiple intervals can be used to test all clock domains.
X-chains register: loaded once per interval, the X-chains register remains unchanged until the next load and helps block all Xs of the interval from reaching the MISR.
XTOL PRPG seed: also loaded only once per interval, but internally the XTOL PRPG is reloaded with the same seed at the beginning of each pattern and advances every shift. The values propagated to the XTOL shadow combine with the setting of the X-chains register to block all Xs.

Reloading the XTOL PRPG Per Pattern

One feature of PS-XLBIST is the automatic reloading of the XTOL PRPG at the beginning of every pattern in an interval. This feature can be implemented as follows: the XTOL PRPG reseed is positioned as the last reseed of every interval, after the CARE PRPG and the X-chains register. Thus, the value loaded in the XTOL PRPG remains in the PRPG Shadow. During application of a pattern, the XTOL PRPG advances every shift; when the shift counter reaches the end of the load process, just before the start of the next pattern load, the XTOL PRPG is re-loaded from the PRPG shadow. Note that only a few gates are added to implement this feature, essentially just the control of reloading the XTOL PRPG.

As all patterns in an interval share the same X-chains register value, fixed for the entire interval, and start with the same XTOL PRPG value, the X-masking is identical for all patterns, per interval, and per CODEC. Thus, if a pattern has an X in, say, cell 20 of chain 5, all patterns of the interval will masks out cell 20 of chain 5. This can be collateral damage if some patterns don't have an X in this cell, but it is a very small collateral damage compared to entire chains unnecessarily masked out in previous approaches. Further, as all patterns in an interval share the same clocking, many Xs naturally appear in the same cell positions in all patterns.

In summary, the XTOL PRPG seed enables per-shift X-masking in PS-XLBIST. The single seed of a PS-XLBIST interval is described below with other features presented in this disclosure.

Controlling XTOL_Enable

In deterministic ATPG patterns, XTOL_enable can be turned ON or OFF with every reseed; when a number of consecutive shifts have no Xs, XTOL_enable can be turned OFF which results in full observe mode while no XTOL PRPG bits are needed to control these shifts. Later, if and when Xs occur, XTOL_enable can be turned back ON.

To achieve the same ability in PS-XLBIST, two new opcodes can be added to XTOL controls to turn XTOL_enable ON and OFF, respectively. Thus, the seed of the XTOL PRPG can be computed so that the "XTOL_enable OFF" opcode appears at the desired shift on the XTOL controls and then later, if needed, the "XTOL_enable ON" opcode follows. Further, the "XTOL_enable OFF" opcode can be selected as the shortest unused opcode, to minimize XTOL PRPG care bit usage, while the "XTOL_enable ON" opcode can be selected as one of the longest unused opcodes, to minimize the chance of it appearing unintended when the XTOL PRPG advances through the don't care region of shifts when XTOL_enable was set OFF.

A possible encoding of all opcodes for a CODEC with 1023 chains is shown in FIG. 1B. Note the Huffman encoding: the length of the opcode is inversely proportional to its usage frequency. For example, only 2 XTOL PRPG "care" bits are needed to select all chains, and only 3 bits to select no chains. From the 64 combinations of "1+6 bits", 32 are used for 1/16 groups and their complements, 16 are used for 1/8 groups and their complements, and 8 are used for 1/4 groups and their complements, leaving 8 more combinations; from these, 4 are used by the two "1+5 bits" selection of 1/2 groups and 2 more by the "1+5 bits" encoding of XTOL_enable OFF. Additionally, (not shown in FIG. 1B), 1 "care" bit per shift from the XTOL PRPG determines whether the XTOL shadow holds or captures the new value from the XTOL PRPG.

The Mask Enable Bit

A single-bit register, mask enable, is added (shaded bit at the right-edge of X-chains register 116). Mask enable is loaded at the same time as the X-chains register, once per XLBIST interval, from the XTOL PRPG 106, through the XTOL phase shifter 110.

When mask enable is OFF, the per-shift X-masking capabilities are disabled. Mask enable can be turned OFF when the X density is too high to take advantage of per-shift X-masking capabilities. In this mode, dynamic X-chains (i.e., chains selected by the X-chains register) can only be observed when selected by the XTOL shadow as a single-chain. The XTOL PRPG selects chains to observe (when XTOL_enable is ON). That is, a chain is masked if the following logical condition evaluates to TRUE:

(dynamic X-chain && NOT (XTOL_enable==ON && single-chain selection of XTOL shadow)||(NOT dynamic X-chain && XTOL_enable==ON && NOT selected by XTOL shadow)

Deterministic ATPG patterns can use the XTOL PRPG and XTOL_enable. When mask enable is ON, the architecture functions in PS-XLBIST mode: the XTOL PRPG selects which chains to mask, rather than which chains to observe. In this mode, a chain is masked if the following logical condition evaluates to TRUE:

XTOL_enable==ON && ((dynamic X-chain && selected by XTOL shadow)||single-chain selection of XTOL shadow)

It is worth highlighting some key differences between the modes when mask enable is OFF and when mask enable is ON. When mask enable is OFF, a single chain can be observed (single-chain selection of XTOL shadow), but a single chain cannot be masked—the minimum masking is typically 1/16 of all chains. On the other hand, when mask enable is ON, a single chain can be masked (single-chain selection of XTOL shadow), but a single chain cannot be observed. In the middle ground, assume the XTOL shadow selects a group of 1/8 of all chains: when mask enable is OFF, the only chains observed are those in the selected group except for dynamic X-chains, so observability is ≤1/8 of all chains; when mask enable is ON, the chains masked are those in the selected group that are also dynamic X-chains, so observability is ≥7/8 of all chains. The following discussion explains, among other things, how pattern generation exploits the features available with mask enable ON.

PS-XLBIST pattern generation is more complex than traditional LBIST. More data can be used to generate more intervals: more seeds, more clocking variety, more X-chains register and XTOL PRPG settings, resulting in tighter blockage of Xs and reduced collateral damage, and ultimately higher coverage. When good-machine simulation has detected Xs propagating to the MISR, either the interval is truncated before the patterns with the new Xs, or a new X-chains register is computed to mask all Xs encountered in the current interval and the simulation of the interval is re-started. Once all Xs have been blocked (and often some non-X cells as well, as collateral damage), fault-simulation is performed. Of course, fault detection credit is given only when the fault effect propagates to an unblocked scan cell.

This process can be extended for PS-XLBIST so that, to block all Xs for each CODEC, a new X-chains register and a new XTOL PRPG are computed (and mask enable is set ON) or, if there are too many Xs, mask enable is set OFF and the algorithm falls back on a process that does not have the per-shift X-masking capabilities.

Figure 2A:
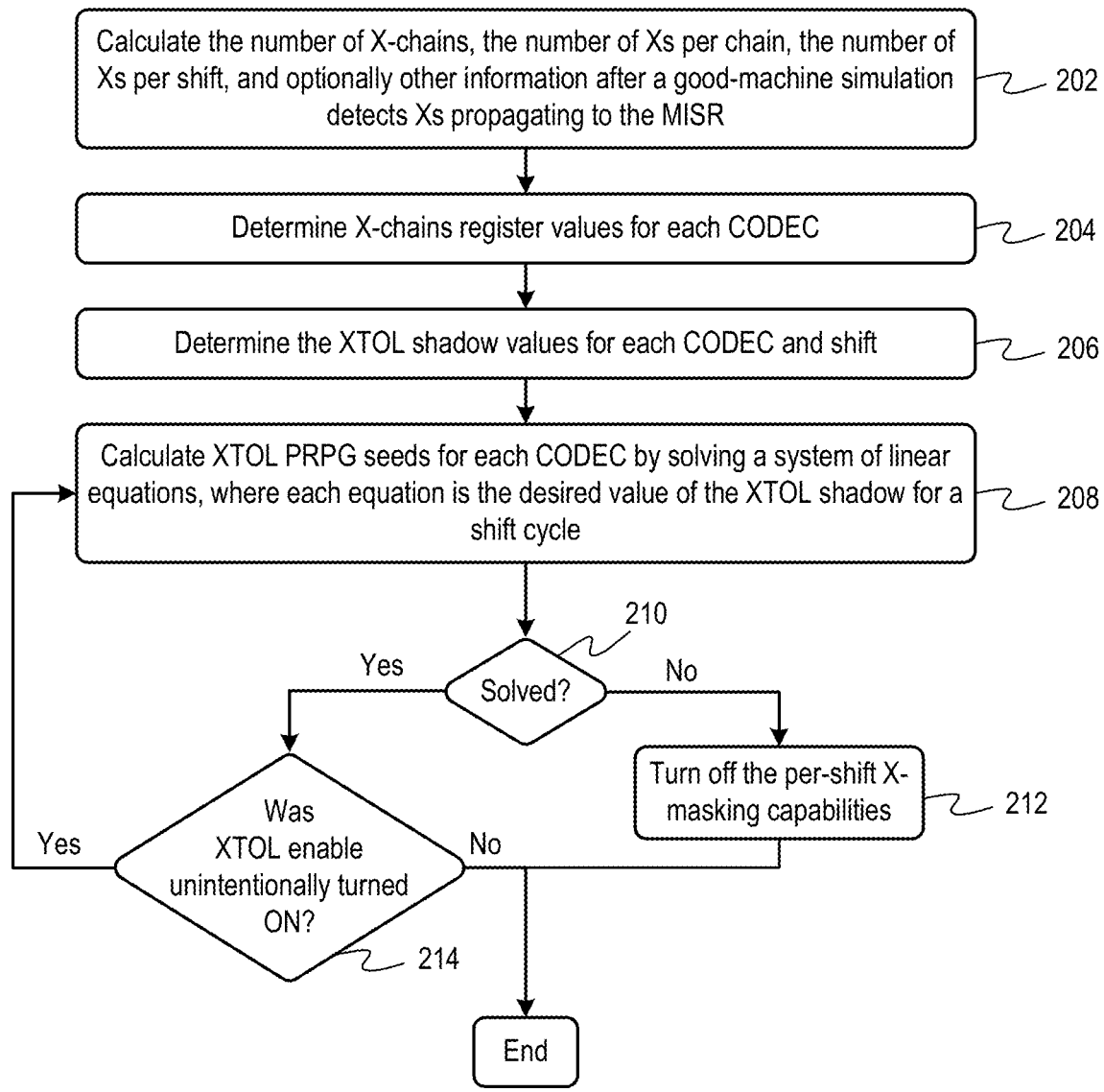
FIG. 2A illustrates a process for determining the X-chains register and XTOL PRPG of interval, after good-machine simulation, in accordance with some embodiments described herein.

FIG. 2A illustrates a process for determining the X-chains register and XTOL PRPG of interval, after good-machine simulation, in accordance with some embodiments described herein. The process can begin by calculating the number of X-chains, the number of Xs for each chain, the number of Xs per shift, and optionally other information after a good-machine simulation detects Xs propagating to the MISR (step 202).

Next, the X-chains register values are determined for each CODEC (step 204), and the XTOL shadow values for each CODEC and shift are determined (step 206). The XTOL PRPG seeds can then be calculated for each CODEC by solving a system of linear equations, where each equation is the desired value of the XTOL shadow for a shift cycle (step 208).

The process can then check if the system of linear equations was successfully solved (step 210). The system of linear equations may have no solution if there are too many Xs and they are distributed in a way that exceeds the capacity of a single XTOL PRPG seed. In this case ("No" branch of step 210), the process can turn off the per-shift X-masking capabilities (step 212), and the process ends. In this scenario, only the X-chains register can be used to block all Xs (which may also block other chains).

On the other hand, when the system of linear equations has a solution ("Yes" branch of step 210) and XTOL_enable was turned OFF for some CODEC, every shift cycle thereafter is checked (as the XTOL PRPG continues advancing during shifts not controlled by the computed seed) for unintentionally turning XTOL_enable ON (step 214). Note that XTOL_enable may be unintentionally turned ON because of the design, as shown in FIG. 1B. If XTOL_enable is not unintentionally turned ON ("No" branch of step 214), then XTOL seeds have successfully been found, and the process ends. On the other hand, if it does happen ("Yes" branch of step 214), then the system of linear equations is solved again (step 208), with a different, random fill of unassigned XTOL PRPG bits in the hope of avoiding accidentally turning XTOL_enable ON. There is an exceedingly low probability that repeated attempts will still fail to avoid unintentionally turning XTOL_enable ON; after a small number of attempts the loop exits (not shown in FIG. 2A for simplicity) and the per-shift X-masking capabilities may be turned off if the multiple attempts fail. Note that in this very low probability situation the X blockage is still complete; the only downside of unintentionally turning XTOL_enable ON is that the shift cycles until the intended XTOL_enable ON may have less than full observability.

Figure 2B:
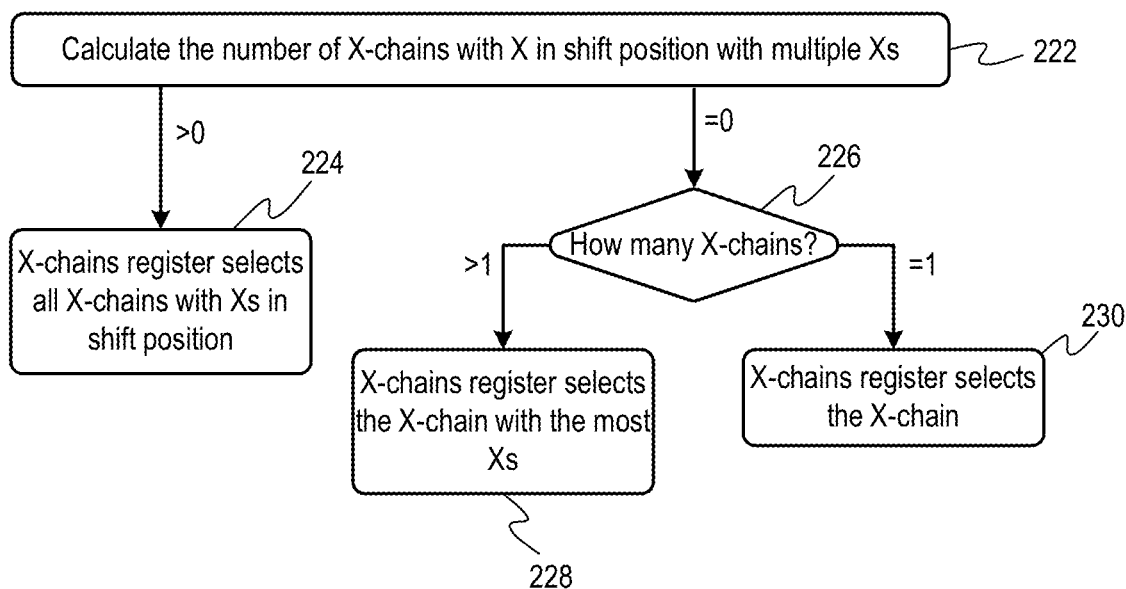
FIG. 2B illustrates a process for determining X-chains register values for each compressor-decompressor (CO-DEC) in accordance with some embodiments described herein.

FIG. 2B illustrates a process for determining X-chains register values for each CODEC in accordance with some embodiments described herein. The process can begin by calculating the number of X-chains with X in shift position with multiple Xs (step 222). If there are one or more X-chains with Xs in shift positions with multiple Xs (from other chains), i.e., the ">0" branch of step 222, then all such chains (and likely others too) will be selected by the X-chains register mode selection (step 224). In this scenario, other X-chains need not be selected by the X-chains register. On the other hand, if there are zero X-chains with an X in shift position with multiple Xs, then the process can check how many X-chains there are (step 226). If there is a single X-chain ("=1" branch of step 226), then the process can set the X-chains register value so that the X-chains register selects the single X-chain (step 230). If there are multiple X-chains (">1" branch of step 226), then the process can set the X-chains register value so that the X-chains register selects the chain with the most Xs (step 228). Note that the X-chains register will always select one or more X-chains (if any). The process illustrated in FIG. 2B works in conjunction with the process illustrated in FIG. 2C (described below) which sets the XTOL shadow, and the combined effect of these two processes is to block all Xs with minimal collateral damage.

FIG. 2C illustrates a process for determining XTOL shadow values for each CODEC and shift in accordance with some embodiments described herein. Sub-processes 252 and 254 are performed for each shift, and then sub-process 256 is performed. Specifically, sub-process 252 is performed for a window of shifts with no Xs, and sub-process 254 is performed when the shift is with X(s).

Note that XTOL_enable starts ON at the beginning of every pattern, as the XTOL PRPG is reloaded from the PRPG shadow. Full observability mode is desired for every shift in every X-free window of shifts which is followed by a shift with Xs. There are two ways to achieve this: either by selecting a mode which does not include any of the dynamic X-chains and holding it for all shifts in the X-free window, or by turning XTOL_enable OFF at the beginning of the window and ON again at the end. The choice that uses the fewest XTOL PRPG bits is selected. This sequence of steps is illustrated in sub-process 252. Specifically, the cost of setting and holding mode and the cost of setting XTOL_enable OFF and then ON are compared. Depending on which cost is lower, sub-process 252 can either (1) set mode which does not include any dynamic X-chain, and hold the mode for rest of shifts with no Xs, or (2) set XTOL_enable OFF at the start of the window and set XTOL_enable ON at the end of the window. Note that holding a mode may use one "care" bit from the XTOL PRPG per shift, whereas turning XTOL_enable OFF and ON has a fixed cost, independent of window size. Thus, the former method can have a lower cost for short windows, while the latter method will have the lower cost for long windows.

In sub-process 254, which is performed for shifts with Xs, if there is a single X per shift, the single X-chain is selected and thus masked; otherwise a mode is selected which includes all chains with Xs in this shift. Note that the process illustrated in FIG. 2B ensures that these chains are also selected by the X-chains register, thus they will be masked.

Finally, in sub-process 256, if there is a final X-free window of shifts, it is handled as above, except there is no need to turn XTOL_enable back ON at the end of the window because it will be set on by the hardware at the beginning of the next pattern.

Figure 3A:
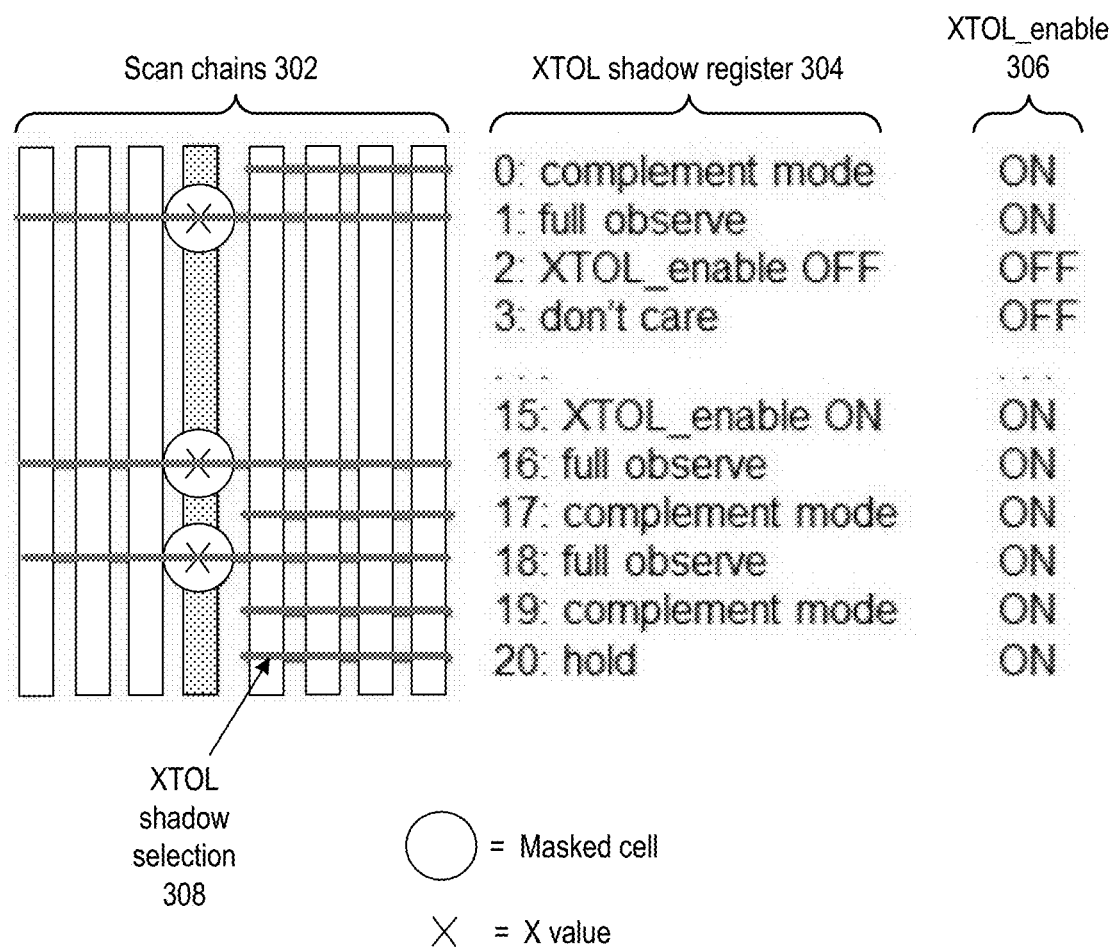
FIGS. 3A-3C illustrate examples of how PS-XLBIST can mask Xs with no or minimal loss of other observability in accordance with some embodiments described herein.
Figure 3B:
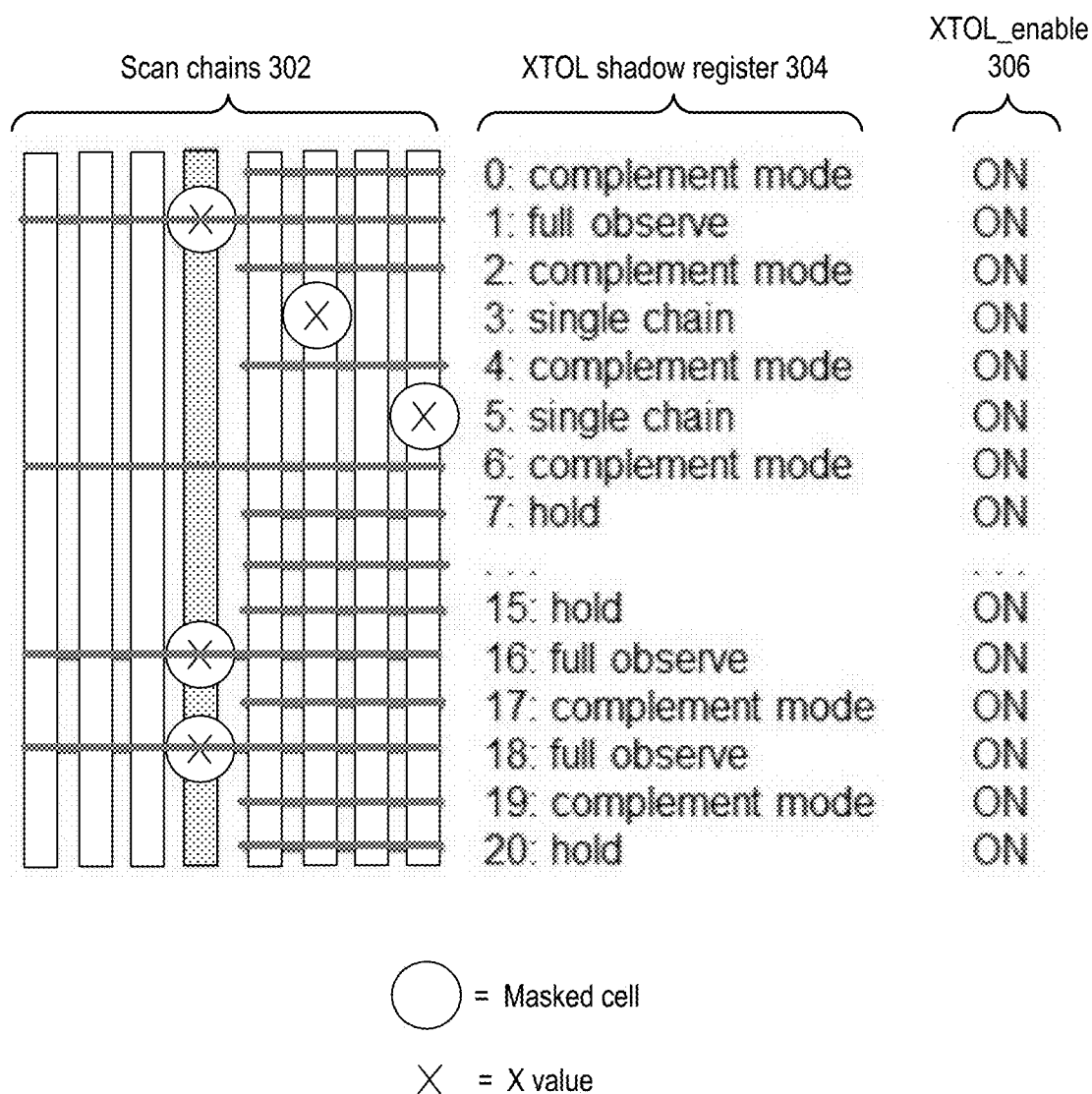
Figure 3C:
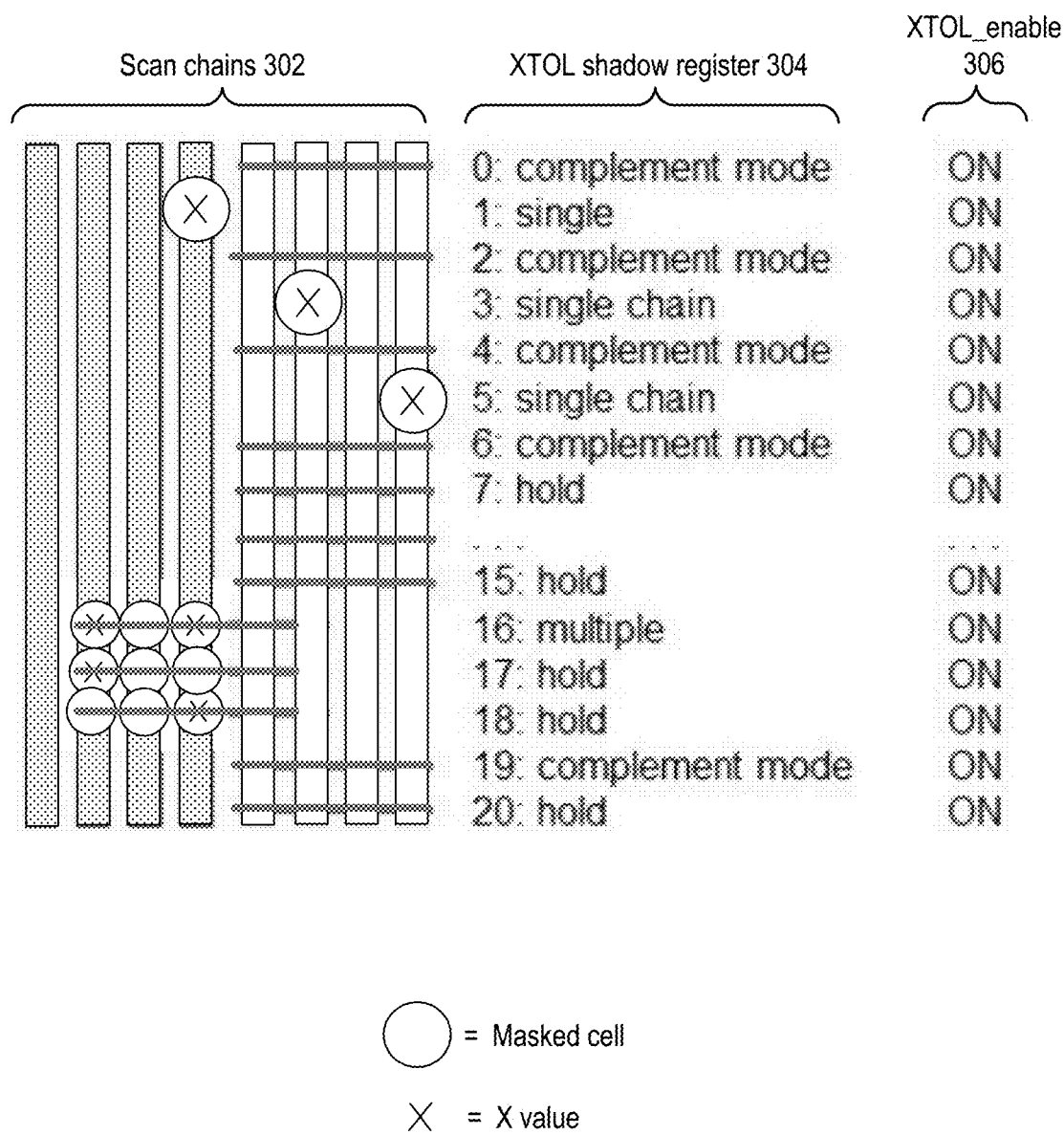

FIGS. 3A-3C illustrate examples of how PS-XLBIST can mask Xs with no or minimal loss of other observability in accordance with some embodiments described herein. In these examples, data in scan chains 302 is shifted from top to down. XTOL shadow register 304 shows the contents of this register for each shift that are number from 0 through 20. Finally, XTOL_enable 306 shows the value of the bit for each shift.

FIG. 3A illustrates a pattern with a small number of Xs in one chain in which all Xs can be masked with no collateral damage. In this example there are Xs on shifts 1, 16 and 18. The X-chains register is set to select the single X-chain (the shaded scan chain). Selecting a single X-chain is what some existing approaches can do, which results in masking the entire chain, thus all but the three X cells would be collateral damage. However, in PS-XLBIST, the XTOL PRPG is also set so that the XTOL shadow generates the selections shown per shift (horizontal lines that run across the scan chains, e.g., XTOL shadow selection 308). In some embodiments, only the cells selected by both X-chains register and XTOL shadow are masked. Thus, when a mode that does not include the X-chain is selected in shift cycle 0, full observability is ensured. When a mode that includes the X-chain is selected in shift cycle 1, (full-observe mode may utilize the fewest bits as shown in FIG. 1B) it ensures the X is masked. XTOL_enable is then turned OFF at shift 2 and back ON at shift 15; no chains are selected by the XTOL shadow in shift 2 or 15 (see FIG. 1B), so all chains are observed. The intermediate shifts 3 through 14 are also in full observe mode because XTOL_enable is OFF. Shifts 16 through 19 repeat the initial pattern: the Xs in shift 16 and 18 are masked, while shifts 17 and 19 ensure full observability. Finally, in shift 20 etc. the XTOL shadow holds (at the cost of only 1 XTOL PRPG care bit per shift). Overall, all X cells and only the X cells are masked.

FIG. 3B illustrates a more complex example. Two additional Xs are added to the previous example shown in FIG. 3A in two other chains, on shifts 3 and 5, respectively. The process illustrated in FIGS. 2A-2C adapts in several ways: first, the two added Xs are masked by selecting single-chain observe mode for shifts 3 and 5 for the respective X-chains, and switching back to complement mode in between for shift 4. Then, because the X-free window is smaller, instead of turning XTOL_enable OFF and later ON (as was shown in FIG. 3A), the complement mode of shift 6 is maintained for the next 9 shifts (as shown in FIG. 3B), as fewer total care bits are used by this option. Again, for the entire pattern, all X cells and only the X cells are masked. Some existing approaches mask 3 X-chains in the examples shown in FIG. 3B which, on average, would mask 650 out of 1000 chains, which is a very high collateral damage.

FIG. 3C further develops the example shown in FIG. 3B by adding another chain with Xs in shifts 16 and 17. Note that, in this case, there are multiple chains with multiple Xs and also a shift, 16, with multiple Xs. The latter forces a multi-chain X-chain register selection which includes the two X-chains and, necessarily, other chains (the shaded chains). The first three Xs, in shifts 1, 3, and 5, are masked by having the XTOL shadow select single-chain mode, whether the Xs are in a dynamic X-chain or not. During the intervening X-free shifts a complement mode is selected that does not include any of the X-chains, thus ensuring full observability. As before, 9 hold cycles stretch the full observability window to shift 16. In shift 16, a multiple mode is selected that includes the two X-chains; the overlap between the X-chains register selection and the XTOL shadow selection masks an additional chain, resulting in one cell of collateral damage. Ideally, a single-chain selection would be used in shift 17. However, if the XTOL PRPG is not long enough to supply enough care bits, shifts 17 and 18 hold the selection of shift 16, incurring some collateral damage. Finally, shifts 19 and over again ensure full observability. In all cases, PS-XLBIST coverage is higher than existing approaches. Specifically, with 3 Xs, the coverage drops of existing approaches drops significantly, whereas PS-XLBIST coverage remains about unchanged (within small random variations).

Figure 4:
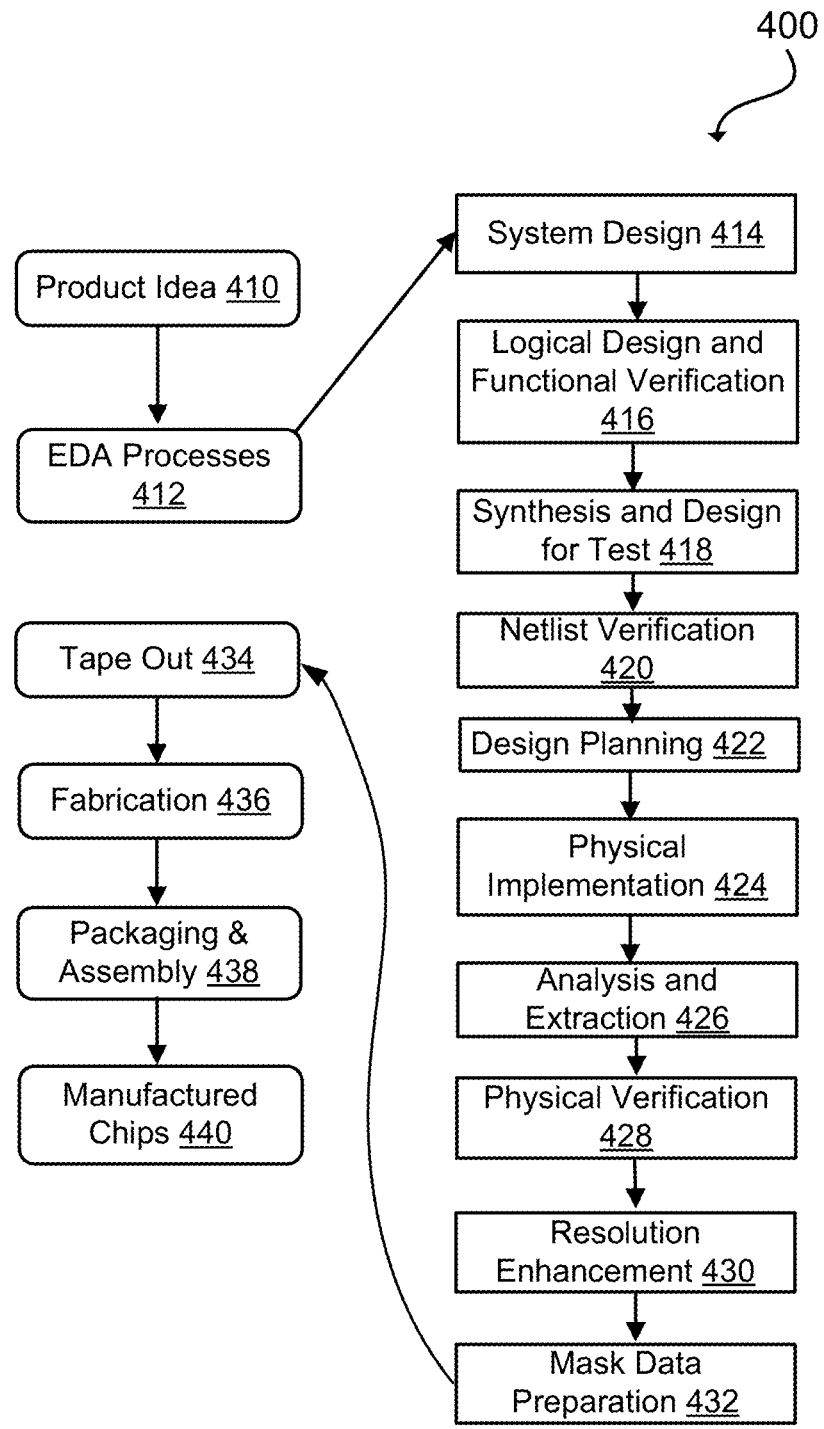
FIG. 4 depicts a flowchart that illustrates an integrated circuit (IC) design and manufacture flow in accordance with some embodiments described herein.

FIG. 4 illustrates an example flow 400 for the design, verification, and fabrication of an integrated circuit in accordance with some embodiments described herein. EDA processes 412 (the acronym "EDA" refers to "Electronic Design Automation") can be used to transform and verify design data and instructions that represent the integrated circuit. Each of these processes can be structured and enabled as multiple modules or operations.

Flow 400 can start with the creation of a product idea 410 with information supplied by a designer, information which is transformed and verified by using EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly 438 are performed to produce the manufactured IC chip 440.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 in FIG. 5) may be used to store the programs and data structures that are used by some or all of the EDA products described herein, and products used for development of cells for the library and for physical and logical design that use the library.

Figure 5:
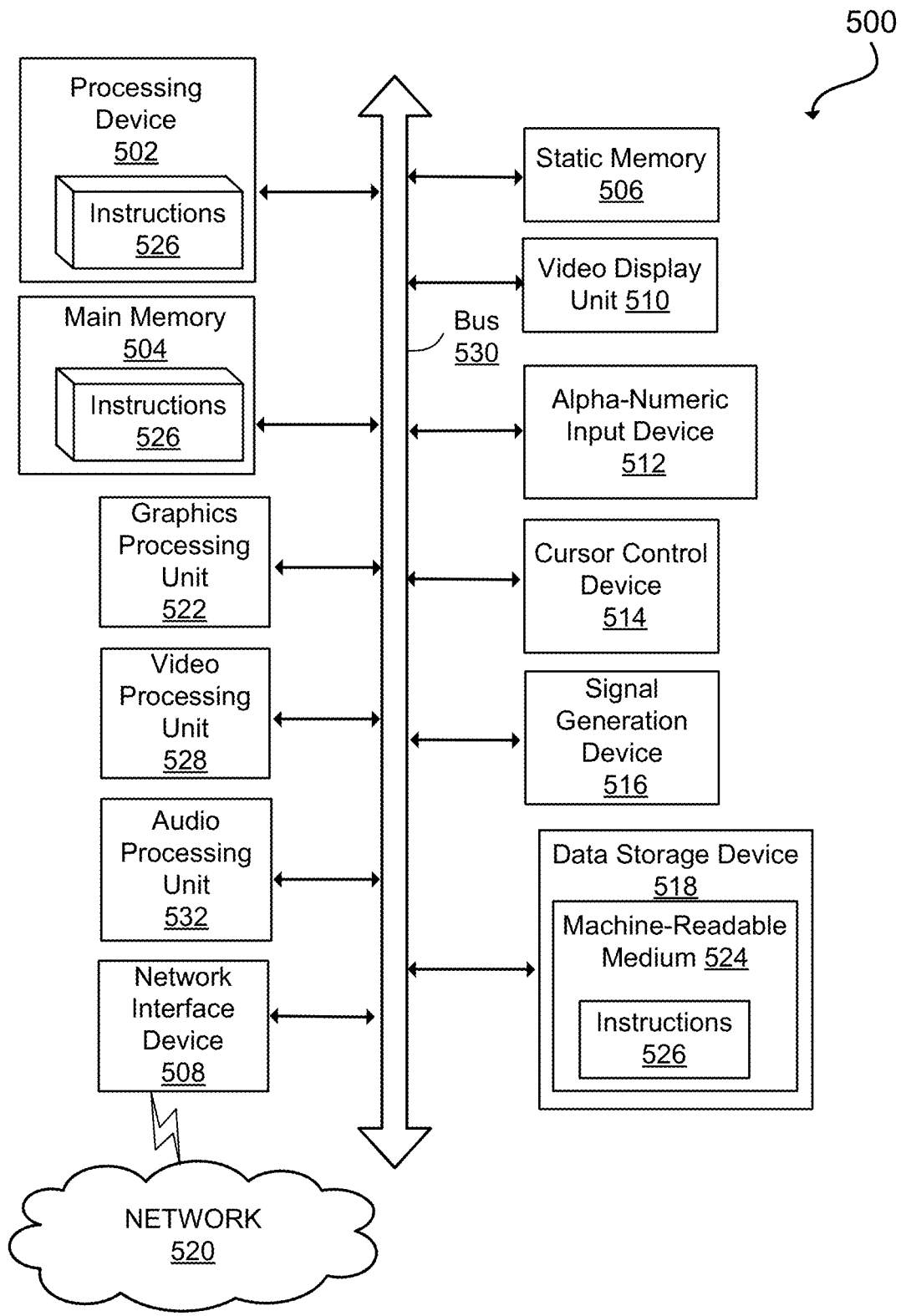
FIG. 5 illustrates an example machine of a computer system within which a set of instructions, for causing the machine to perform any one or more of the methodologies discussed herein, may be executed in accordance with some embodiments described herein.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit, comprising:
   a first register to store a first value that specifies a first subset of a set of scan chains, wherein the first subset of the set of scan chains includes scan cells that are desired to be masked, wherein the first value is generated based on a first seed, wherein the first value remains constant during an interval of a test, wherein the test comprises multiple intervals, and wherein each interval comprises multiple patterns;
   a second register to store a second value that specifies, in each shift cycle, a second subset of the set of scan chains, wherein the second subset of the set of scan chains includes scan cells that are desired to be masked, and wherein the second value is generated based on a second seed which is reloaded into a third register at a beginning of each pattern in each interval; and
   a masking circuit to mask, in each shift cycle, scan cells in a third subset of the set of scan chains that is an intersection of the first subset of the set of scan chains and the second subset of the set of scan chains.

2. The circuit of claim 1, wherein the masking circuit receives values from the set of scan chains in each shift cycle, and selectively blocks or passes the values to an unload compressor circuit.

3. The circuit of claim 1, wherein the second value is generated by a pseudo-random pattern generator (PRPG) based on the second seed, and wherein the second seed is determined by solving a system of linear equations.

4. The circuit of claim 3, wherein the circuit is part of a per-shift X-tolerant logic built-in self-test (PS-XLBIST) system.

5. The circuit of claim 4, wherein the test is performed by the PS-XLBIST system.

6. The circuit of claim 4, wherein the second value is updated in each shift cycle during each interval.

7. The circuit of claim 4, wherein the third register is associated with the PRPG.

8. A method, comprising:
   storing a first value in a first hardware register, the first value specifying a first subset of a set of scan chains, wherein the first subset of the set of scan chains includes scan cells that are desired to be masked, wherein the first value is generated based on a first seed, wherein the first value remains constant during an interval of a test, wherein the test comprises multiple intervals, and wherein each interval comprises multiple patterns;
   storing a second value in a second hardware register, the second value specifying, in each shift cycle, a second subset of the set of scan chains, wherein the second subset of the set of scan chains includes scan cells that are desired to be masked, and wherein the second value is generated based on a second seed which is reloaded into a third register at a beginning of each pattern in each interval; and
   masking, in each shift cycle, scan cells in a third subset of the set of scan chains that is an intersection of the first subset of the set of scan chains and the second subset of the set of scan chains.

9. The method of claim 8, comprising:
   receiving values from the set of scan chains in each shift cycle; and
   selectively blocking or passing the values to an unload compressor circuit.

10. The method of claim 8, wherein the second value is generated by a pseudo-random pattern generator (PRPG) based on the second seed, and wherein the second seed is determined by solving a system of linear equations.

11. The method of claim 10, wherein the method is performed during a per-shift X-tolerant logic built-in self-test (PS-XLBIST) run.

12. The method of claim 11, wherein the second value is updated in each shift cycle during each interval of the PS-XLBIST run.

13. The method of claim 11, wherein the third register is associated with the PRPG.

14. A circuit, comprising:
a set of scan chains;
a decompressor circuit coupled to the set of scan chains;
a first register to store a first value that specifies a first subset of the set of scan chains, wherein the first subset of the set of scan chains includes scan cells that are desired to be masked, wherein the first value is generated based on a first seed, wherein the first value remains constant during an interval of a test, wherein the test comprises multiple intervals, and wherein each interval comprises multiple patterns;
a second register to store a second value that specifies, in each shift cycle, a second subset of the set of scan chains, wherein the second subset of the set of scan chains includes scan cells that are desired to be masked, and wherein the second value is generated based on a second seed which is reloaded into a third register at a beginning of each pattern in each interval;
a masking circuit coupled to the set of scan chains, wherein the masking circuit masks, in each shift cycle, scan cells in a third subset of the set of scan chains that is an intersection of the first subset of the set of scan chains and the second subset of the set of scan chains; and
an unload compressor circuit coupled to the masking circuit.

15. The circuit of claim 12, wherein the masking circuit receives values from the set of scan chains in each shift cycle, and selectively blocks or passes the values to the unload compressor circuit.

16. The circuit of claim 14, wherein the second value is generated by a pseudo-random pattern generator (PRPG) based on the second seed, wherein the second seed is determined by solving a system of linear equations, wherein the circuit is part of a per-shift X-tolerant logic built-in self-test (PS-XLBIST) system, and wherein the second value is updated in each shift cycle during each interval of the PS-XLBIST run.

* * * * *